United States Patent
Ali et al.

(10) Patent No.: US 6,798,069 B1
(45) Date of Patent: Sep. 28, 2004

(54) INTEGRATED CIRCUIT HAVING ADAPTABLE CORE AND INPUT/OUTPUT REGIONS WITH MULTI-LAYER PAD TRACE CONDUCTORS

(75) Inventors: Anwar Ali, San Jose, CA (US); Tauman T. Lau, San Jose, CA (US); Kalyan Doddapaneni, Mountain View, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/402,054

(22) Filed: Mar. 28, 2003

(51) Int. Cl.[7] ............................................. H01L 23/48
(52) U.S. Cl. ....................... 257/775; 257/203; 257/208; 257/210; 257/211
(58) Field of Search ................................ 257/786, 203, 257/207, 208, 210, 211, 698, 775

(56) References Cited

U.S. PATENT DOCUMENTS 5,973,397 A * 10/1999 Low et al. .................. 257/698
6,008,532 A * 12/1999 Carichner ................... 257/691
6,252,298 B1 * 6/2001 Lee et al. ................... 257/668
6,331,736 B1 * 12/2001 Duesman et al. ........... 257/778

* cited by examiner

Primary Examiner—Nathan J. Flynn
Assistant Examiner—Pershelle Greene
(74) Attorney, Agent, or Firm—Conley Rose, P.C.

(57) ABSTRACT

An integrated circuit is provided which includes at a first, a second, or a third row of bonding pads. A plurality of trace conductors is provided to route the signal of each bonding pad to an I/O ring and/or a core. The trace conductors of different metal widths are configured on a separate and distinct metal layers such that routing may be done above or below the bonding pad rows and other trace conductors. A plurality of vias is provided to connect between the different metal layers. This allows multiple rows of bonding pads to be arranged on the perimeters of the core without having to compromise for small pitch distances or longer routing paths.

31 Claims, 8 Drawing Sheets

INTEGRATED CIRCUIT HAVING ADAPTABLE CORE AND INPUT/OUTPUT REGIONS WITH MULTI-LAYER PAD TRACE CONDUCTORS

BACKGROUND OF THE INVENTION

1. Field of Invention

This invention relates to integrated circuits, and more particularly to integrated circuit layout using multi-layer trace conductors extending from probe pads of the integrated circuit to accommodate dissimilar-sized core and input/output regions.

2. Description of Related Art

The following descriptions and examples are not admitted to be prior art by virtue of their inclusion within this section.

Integrated circuits have evolved over the years. In part, the enhancement in semiconductor components (e.g., smaller and faster transistors) has contributed to the increased functionality and speed of integrated circuits (ICs). Modem ICs have become denser in overall circuit components and employ smaller critical dimensions. Manufacturing of these modern ICs has also advanced in order to maintain pace with the growing number of components involved for each IC. As the IC becomes smaller in critical dimension and denser in circuitry, the number of bonding pads per IC has also increased.

Typically, the bonding pads of an IC are arranged on the periphery of that circuit. An IC can encompass a single die within a plurality of dice which form a wafer. Generally, the bonding pads are arranged near the outer edge of the die. The bonding pads extend along a single line, or axis, adjacent to each of the four edges of the die. In addition, the bonding pads can form a multitude of single lines parallel to a first single line that can encompass the circuit. Each of the bonding pads is exclusively reserved for a signal. Some bonding pads of the IC may be coupled to terminals of the device package configured to supply power and ground signals to the core of the IC, while other bonding pads are reserved for signals coming to or from the core. The core contains a plurality of circuitry adapted for a specific process. For example, an Application Specific Integrated Circuits ("ASIC") chip has a plurality of circuits adapted to perform a specific function. The complexity of a core, therefore, is dependent on specific needs of an application.

The IC also includes an I/O ring which encompasses the perimeter of the core and typically lies in the outer periphery of the die. Within the I/O ring can be dedicated regions or slots. Each slot can contain an I/O circuit corresponding to a one bonding pad. The circuitry can be used to protect the integrity of the signal being received or sent from the core. For example, the circuitry can provide electrostatic discharge (ESD) protection or can be receivers, drivers, or buffers coupled to boost or isolate the path of a signal. In order to connect the bonding pads to the I/O ring or core, the IC includes a plurality of trace conductors. The trace conductors are metal wires printed onto the substrate and adapted to route a signal from a bonding pad to the core or I/O slot. However, as the die size of ICs decreases and the density of the core increasing, the routing of trace conductors has become more difficult. Constraints on the routing path due to the increase in I/O components (i.e., bonding pads, I/O circuitry, etc) needed to accommodate the increasing circuitry of the core have limited the use of multiple rows of bonding pads.

It would be desirable to provide a mechanism for routing the bonding pad rows to the I/O ring and core while maintaining signal integrity. It would further be desirable to effectively provide multiple rows of bonding pads to accommodate the high number of I/O circuitry while maintaining or decreasing the size of the die area. The desired improvements would, therefore, achieve an adequate means to increase manufacturing yield of a wafer.

SUMMARY OF THE INVENTION

The problems outlined above may be in large part addressed by an integrated circuit that includes multiple pad rows used to accommodate the evolving integrated circuits with small critical dimensions and dense circuitry. A plurality of trace conductors is used to interface a core or an Input/Output (I/O) ring to external peripheries of the integrated chips and are configured in multiple metal layers and possibly using different trace conductor widths.

In one embodiment, a first and second row of bonding pads are connected to a core and/or an I/O ring using a plurality of trace conductors. The core contains circuitry designed for specific application (i.e. an ASIC design). The I/O ring comprises a plurality of I/O circuits arranged along an axis parallel to the first and second row of bonding pads. Each I/O circuit is configured to couple with a corresponding bonding pad of either the first or second row and reserved for receiving a signal placed onto that bonding pad.

The first and second rows of bonding pads can be configured on separate metal layers, e.g., a first metal layer and a second metal layer, respectively. The first row of bonding pads encompasses all perimeters of a core and is situated closer to the interior of the IC. The second row of bonding pads is placed along an axis parallel to and dielectrically spaced from the first row and also is further from the interior of the IC. A first trace conductor can be arranged on the second metal layer extending from a first bonding pad within the second row. A second trace conductor configured on the second metal layer is extended from a second bonding pad within the second row. The first trace conductor can be routed between a first neighboring pair of the first row of bonding pads and connects the bonding pad to the I/O ring and/or core. In addition, the first trace conductor can be routed underneath the first row of bonding pads. Similarly, the second trace conductor, of differing width than the first trace conductor, is routed between a second neighboring pair of the first row of bonding pads towards the I/O ring or core and can be routed underneath the first row. The different widths of the trace conductors provide resistance compensation for signals that require differing input/output resistance. For instance, a power bonding pad and/or a ground bonding pad have constrained resistance requirements but may be located within the second row of the bonding pads. Extending the routing path of the power bonding pad and ground bonding pad increases the resistance, contrary to the lower resistance needed for such paths. By utilizing a wider metal layer, the resistance may be lowered, even for paths that extend to the more distal outer rows of bonding pads.

A third row of bonding pads can also be provided. The third row is situated along an axis parallel to the first and second rows and includes a plurality of trace conductors coupled to interface external peripheries to the core and/or I/O ring. The third row of bonding pads can be configured in a third metal layer, and has a third trace conductor extending from a bonding pad of the third row. The third trace conductor can contact to either the core or I/O ring using a via. The third trace conductor can be routed between a neighboring pair of bonding pads of the second row and a neighboring pair of bonding pads of the first row. For example, a trace conductor, dedicated to receiving a power supply can be within the third row to provide a power signal to the power supply conductor of an I/O ring. The via is extended between the third trace conductor and the power supply conductor, providing contact between different metal layers. In addition, the third trace conductor may further extend into a core through a via to deliver the power signal to the core.

In an alternative embodiment, the first, second, and third bonding rows are configured on the same metal layer, e.g., a first metal layer. The first, second, and third trace conductors are used to route between the bonding pads and the I/O ring and/or core in a second metal layer dielectrically spaced beneath the first metal layer. A via is used in order for a contact to be made between the bonding rows and the trace conductors. For example, to contact a trace conductor from the second metal layer to a bonding pad in the second row configured in the first metal layer, a via is extended perpendicular to the first and second bonding rows. The via is routed between the bonding pads of the second row and the underlying trace conductor.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 1A:
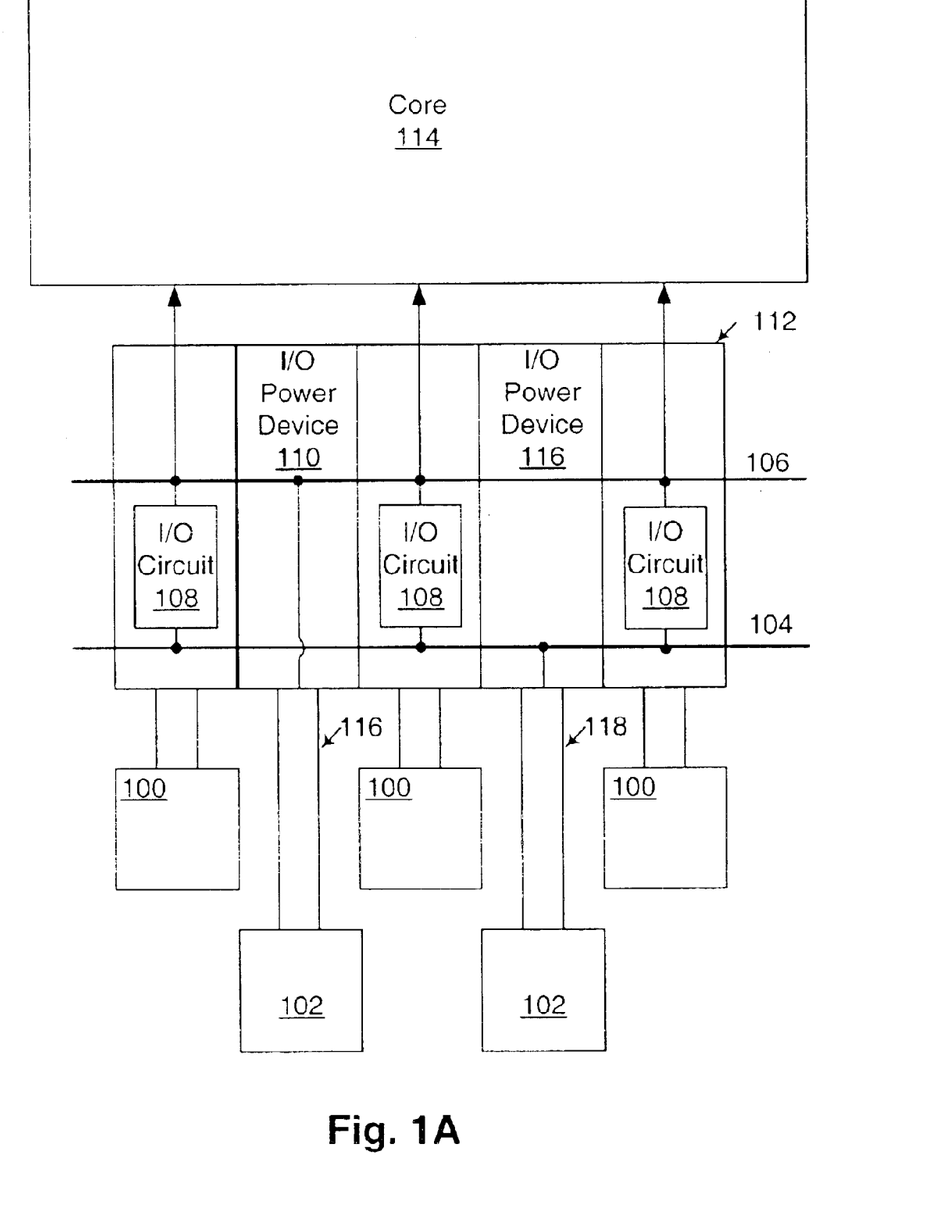
FIG. 1A is a block diagram of a portion of an integrated circuit having bonding pads supplying power and ground signals to an I/O ring.
Figure 1B:
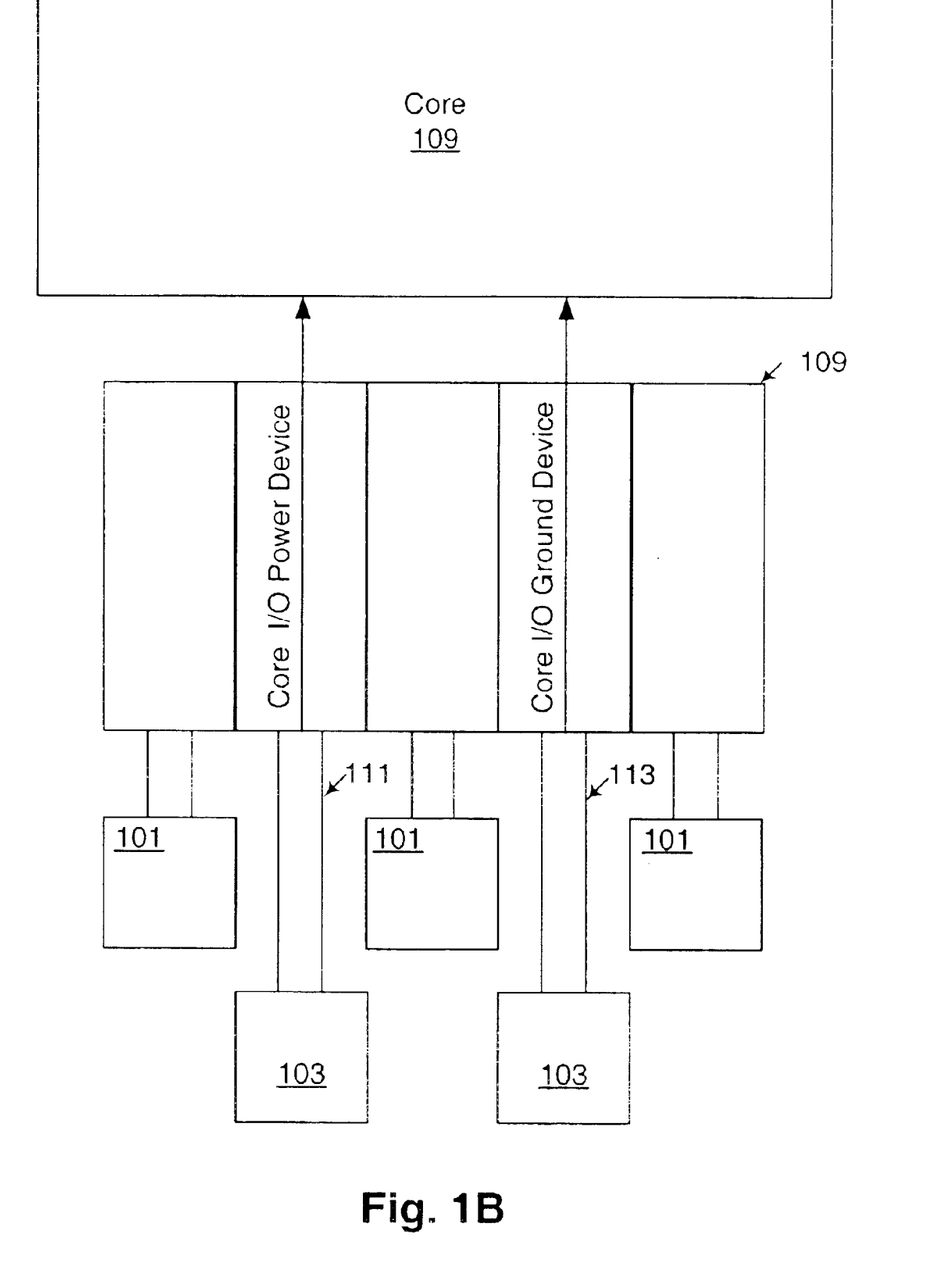
FIG. 1B is a block diagram of a portion of an integrated circuit having bonding pads supplying power and ground signals to a core.

Turning to the drawings, FIG. 1A and FIG. 1B illustrates a portion of an IC comprising an I/O ring and core. Both the I/O ring and core require a plurality of bonding pads to connect and interface with external peripheries. FIG. 1A illustrates a portion of an IC including an I/O ring coupled to receive power and ground signals. The integrated circuit may also include a plurality of bonding pads, formed in rows, and configured near the edges of the integrated circuit. A spaced set of bonding pads that are aligned along a line is hereinafter "a row of bonding pads." The rows of bonding pads are extended along a horizontal axis along one periphery of the integrated circuit and encompasses core 114 on all four sides (not shown). First row of bonding pads 100 may be connected to I/O ring 112 and may comprise of signal pads. However, it is noted that the bonding pads may also include power or ground pads. Within I/O ring 112 are a plurality of I/O circuits 108. Each I/O circuit may be coupled to provide ESD protection for the signal and may also include buffers, drivers, receivers that direct the signal path to and from the core.

Second row of bonding pads 102 extends on an axis parallel to first row 100 on the outer periphery and is dielectrically spaced on a different plane from first row 100, according to one example. Second row 102 may include, but is not limited to, an I/O power pad and/or an I/O ground pad. I/O power and I/O ground pads are coupled to deliver a voltage supply to I/O ring 112 and connects to voltage bus 106 and ground bus 104, respectively. The I/O power pad is connect to I/O power device 110 contained within I/O ring 112. Similarly, the I/O ground pad is connected to 110 ground device 116 of I/O ring 112.

FIG. 1B illustrates a portion of an integrated circuit receiving power and ground signals extended from the I/O ring to a core. The integrated circuit includes first row of bonding pads 101 and second row of bonding pads 103. First row 101 may be comprised of a plurality of signal pads. In addition, first row 101 may comprise power and ground pads needed for the core and/or I/O circuits. In the example shown in FIG. 1B, the core power and core ground pads are located in second row 103, in which second row 103 may comprise a plurality of core power and ground pads or a plurality of signal pads or a combination of both. Core power and core ground pads are routed via trace conductors 111 and 113 respectively, to I/O ring 109. The core power pad is coupled to core I/O power deice 105 as the core ground is coupled to core I/O ground device 115.

Figure 2A:
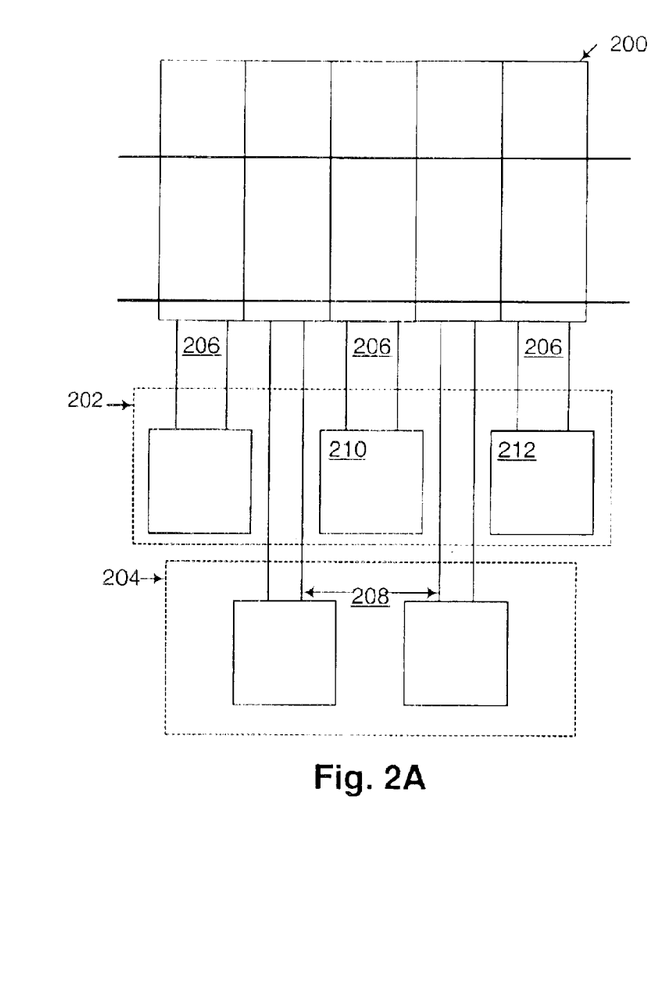
FIG. 2A is a block diagram of a plurality of bonding pads including outer bonding pads constrained by the pitch distance of the inner bonding pads.

In order to illustrate the routing of the bonding pads to the I/O ring or core, FIG. 2A shows a portion of I/O ring 200 comprising first row of bonding pads 202 and second row of bonding pads 204. First row 202 and second row 204 may comprise signal pads, power pads, and/or ground pads. Trace conductors 206 connect each of the bonding pads of first row 202 to I/O ring 200. The width of trace conductor 206 is not constrained by the pitch distance of a neighboring bonding pad. However, trace conductors 208, routing each of second row of bonding pads 204 to I/O ring 200, are limited to a certain width because each trace conductor needs to be dielectrically spaced from a pair of neighboring pads (e.g., bonding pad 210 and bonding pad 212) of first row 202. This is particularly problematic for power and ground pads located in second row 204. For example, second row 204 may comprise a power pad or a ground pad. A trace conductor (e.g., trace conductor 208) routes the power pad from second row 204 to I/O ring 200. The metal width of the trace conductor must be narrow enough to be routed between two bonding pad of a first row (e.g., first row 202). However, routing a bonding pad from the second row requires the trace conductor be made longer than if were routed from the first row. Also, the metal width constraints due to the pitch distance between two bonding pads of a row of bonding pads also increase the resistance for the signal path. It is beneficial that the routing of power and ground signals to a core or I/O ring (e.g., I/O ring 200) have the lowest resistive path possible. If the trace conductors are relatively long, the integrity of the power and ground signals can be compromised.

Figure 2B:
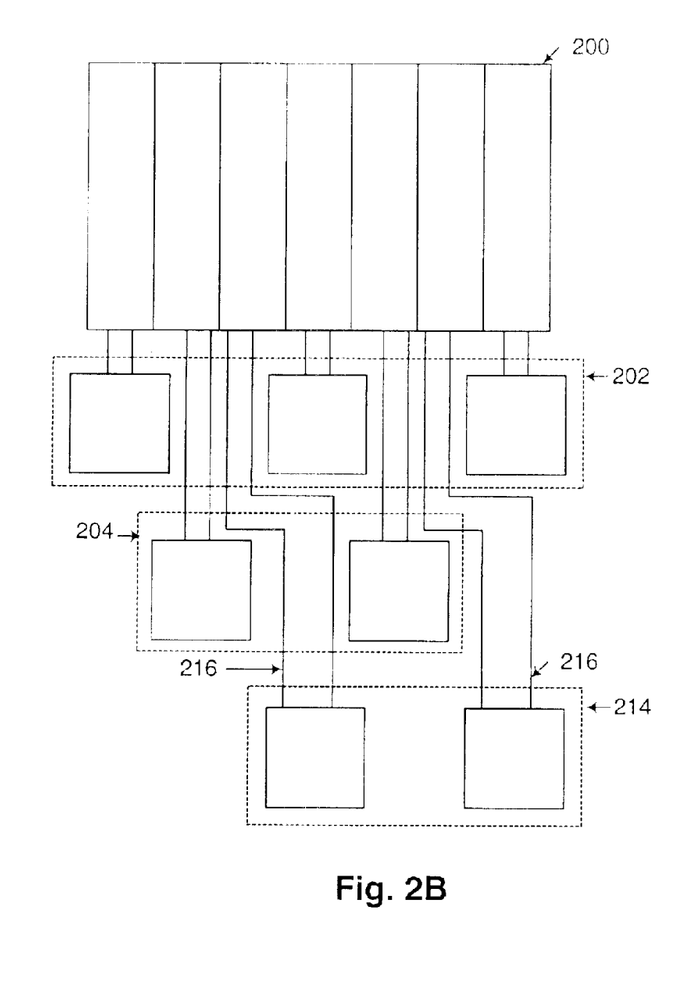
FIG. 2B is a block diagram of a plurality of bonding pad rows having constraints due to pitch distances.

Modern integrated circuits have evolved to a denser logic core area due to the integration of smaller devices. To accommodate for the denser circuitry, additional rows of bonding pads may be included in the integrated circuit, as illustrated in FIG. 2B. Third bonding pad row 214 extends on an axis parallel to and dielectrically spaced from second row 204 on the outer periphery. However, one consequence of introducing additional rows of bonding pads is the further increase of resistance along a path from an outer bonding pad row. For example, the resistance on trace conductors 216 is higher due to the longer routing path as well as the different widths associated with routing between bonding pads of inner rows. In addition, the multiple rows of bonding pads may make routing of trace conductors (e.g., trace conductors 216) more difficult. The pitch distance between a neighboring pair of bonding pads in second row 204 differs from the pitch distance between a neighboring pair of bonding pads in first row 202. The result of an increase in I/O density is an imbalance of resistance values across the multiple bond pad rows.

Another problem with the above designs is the inclusion of power and ground devices within the I/O ring (e.g., I/O power device 110, I/O ground device 116, core I/O power device 105, or core ground device 115). Such an inclusion increases the size of the I/O ring and reduces the space available for standard I/O circuits. The overall effect is an increase of the die size of an IC, and thereby, reducing the number of ICs available on a wafer. This will cause the manufacturing yield to decrease and the production cost to increase. Therefore, it would be of benefit to have an integrated circuit and method that allows for multiple bonding rows to support modern ICs, a routing method that reduces resistance of power and ground signals, and a means to deliver power and ground sources to the core and I/O ring without compromising the overall die size.

Figure 3:
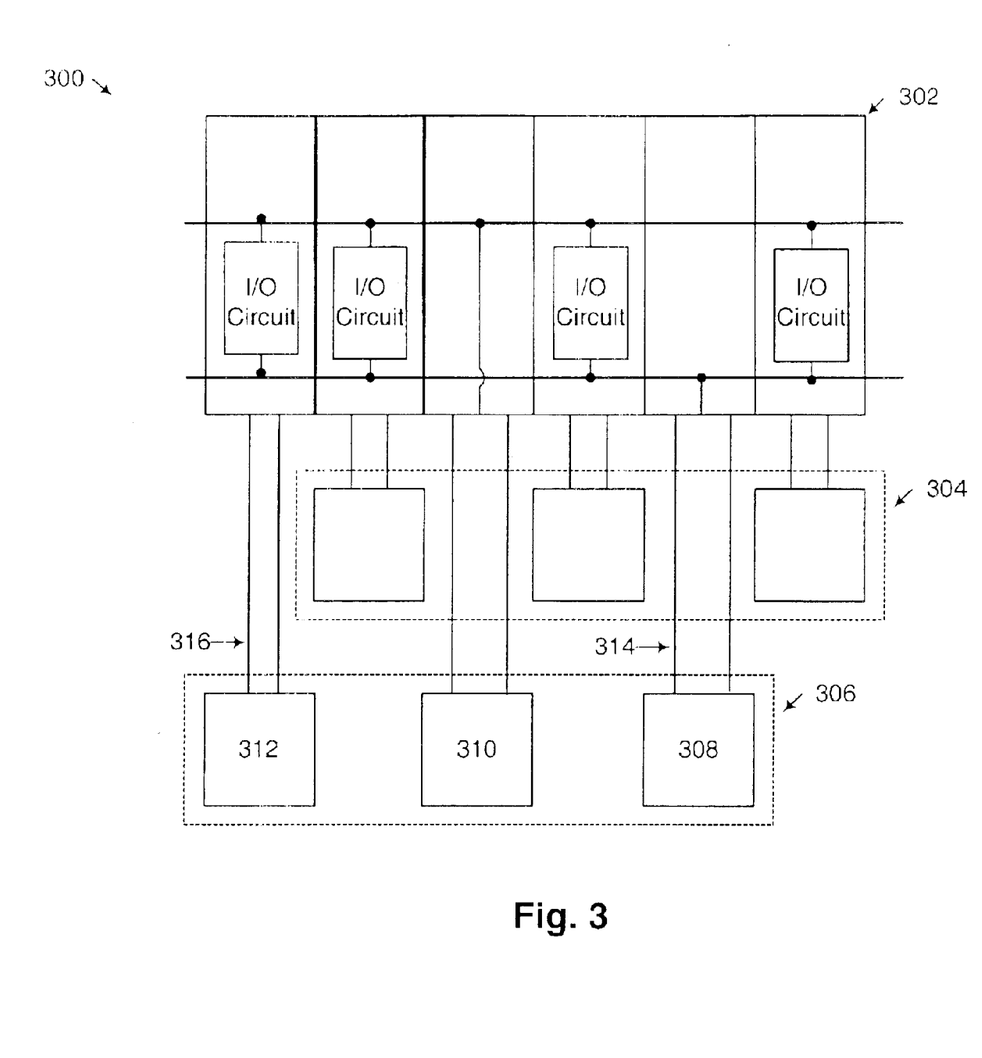
FIG. 3 is a block diagram having trace conductors configured in multiple metal layers and having multiple metal widths.

FIG. 3 illustrates a portion of IC 300 comprising a portion 302 of I/O ring. First row of bonding pads 304 extends on an axis on the outer periphery of IC 300 and may comprise a plurality of bonding pads. Second row of bonding pads 306 extends on an axis parallel to and dielectrically spaced from the first row 304, and may comprise a plurality of bonding pads. The example illustrated in FIG. 3 depicts second row 306 comprising I/O ground pad 308, I/O power pad 310, and signal pad 312. First trace conductor 314 with a first width routes power pad 310 to I/O ring 302. Similarly, second trace conductor 316, with a second width different from the width of first trace conductor 314, routes signal pad 312 to I/O ring 302. By using multiple metal widths, the metal resources are more efficiently allocated for signals that are driven by resistance requirements. For example, the metal widths for both I/O ground pad 308 and I/O power pad 310 is wider than signal pad 312 because the signal paths may not be constrained by resistance requirements as much as power and ground signals.

Pitch distances between bonding pads may not be feasible when trying to route a trace conductor with a wider metal layer. Using a wider metal width may cause the trace conductors to not be dielectrically spaced to surrounding, co-planar metal layers. However, IC 400 of FIG. 4 includes sufficient layers to route trace conductors below bonding pads that allow for wider metal widths and the preservation of signal integrity by allowing the trace conductors to be placed in a separate and distinct layer below the inner row of bonding pads (e.g., the first row of bonding pads). First row of bonding pads 404 includes a plurality of bonding pads configured in a first metal layer. Trace conductors 4 are configured in a second metal layer and routes each of the bonding pads of first row 404 to I/O ring 402. Second row of bonding pads 406, in a first metal layer, is dielectrically spaced from and extends on an axis parallel to first row 404. In the example, illustrated in FIG. 4, second row 406 may comprise power and ground pads. It is noted that second row 406 may also comprise signal pads or a combination of both signal pads and power and ground pads. For the sake of brevity, the multiple combinations are not shown in FIG. 4. Trace conductors 408 configured in a second metal layer, are used to route the bonding pads of second row 406 to I/O ring 402. Since the resistance levels of the power and ground pads need to be as low as possible, a wider metal width is required. The metal width of trace conductors 408 are however, not limited by the pitch distances first row 404. In fact, each trace conductor is dielectrically spaced underneath the plurality of bonding pads of first row 404 such that metal width 414 of trace conductors 408 can be made wider than the pitch distance 416 between neighboring pair of bonding pads 410 and 412 of first row 404.

Figure 4:
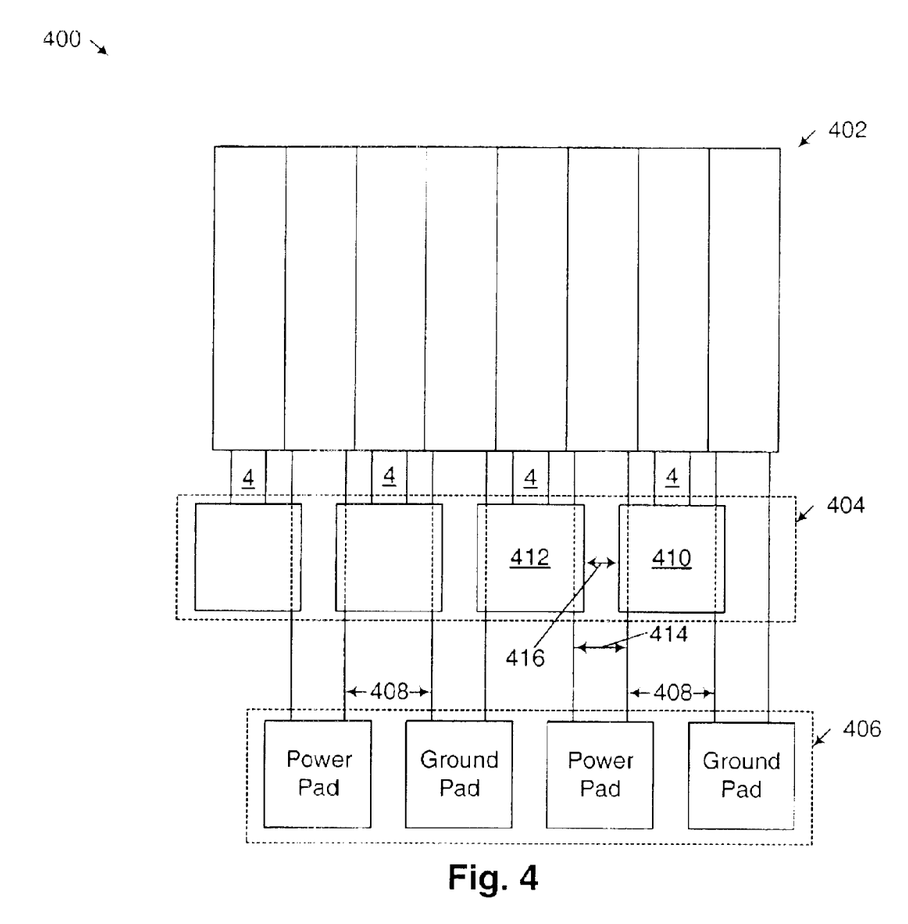
FIG. 4 is a block diagram of a set of trace conductors routed underneath a set of bonding pads.

In an alternative embodiment, first row 402 and second row 404 are configured on the same metal layer (e.g., a first metal layer). Trace conductors 4 and 6 are co-planar to each other and extend in a different metal layer (e.g., a second metal layer) dielectrically spaced from the layer that accommodates the bonding pads.

Figure 5:
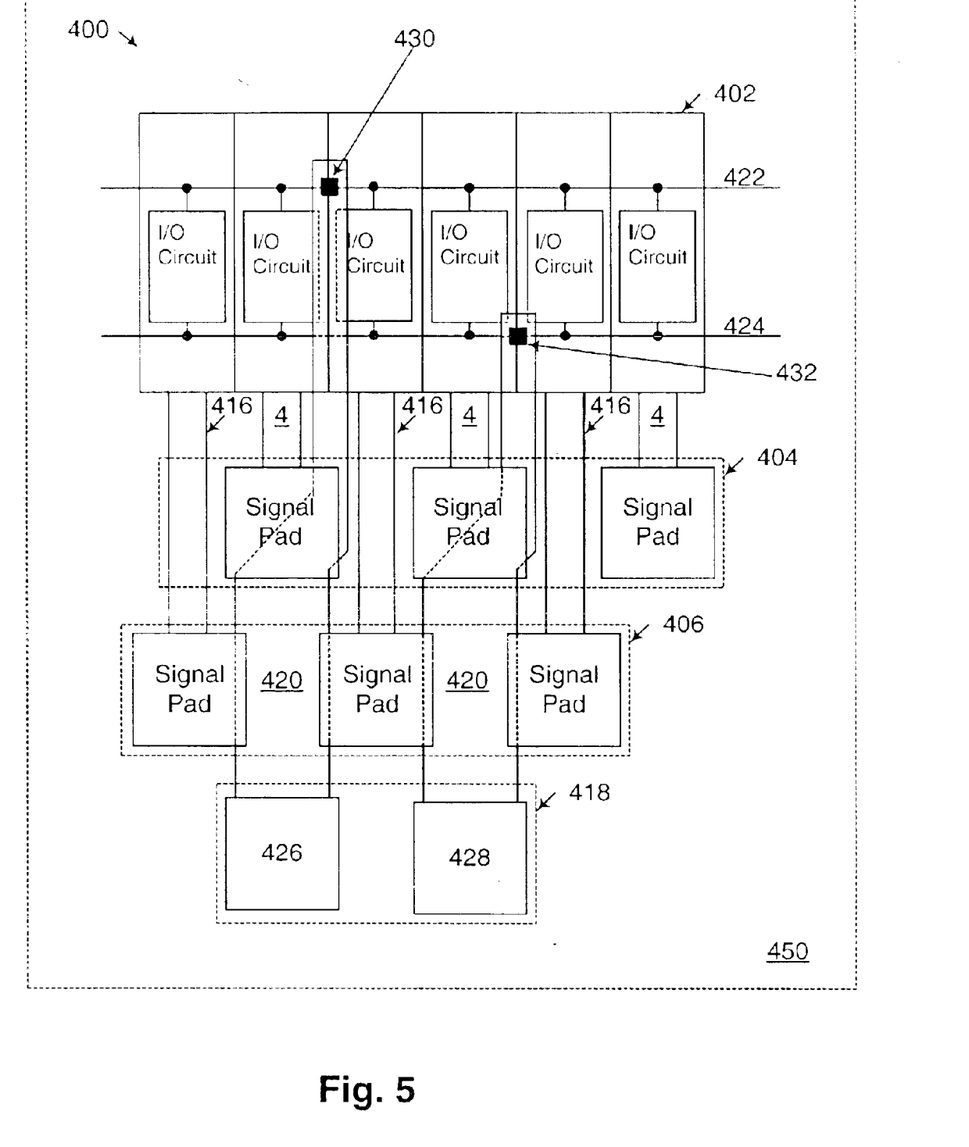
FIG. 5 is a block diagram of a portion of an 110 ring with multiple pad rows and vias to connecting the signal from the I/O pad to the I/O circuitry.

FIG. 5 illustrates IC 400 including third row of bonding pads 418. Each row of bonding pads is configured on a separate metal layer. Trace conductors 4 and 416 are configured in a second metal layer and trace conductors 420 are configured in a third metal layer. By placing the trace conductors in a layer that is separate, distinct, and dielectrically spaced from the metal layers of the I/O ring, the trace conductors may be extended up to the I/O ring and directly connect to components. For example, third row 418 may include, but is not limited to, I/O power pad 426 and I/O ground pad 428. Power pad 426 and ground pad 428 are extended towards I/O ring 402 by being routed between and underneath neighboring pairs of bonding pads of second row 406 as well as between and underneath neighboring pairs of bonding pads of first row 404. Via 430 is used to directly connect between power pad 426 and power bus 422. Similarly, ground pad 428 is connected to ground bus 424 through via 432.

Figure 6:
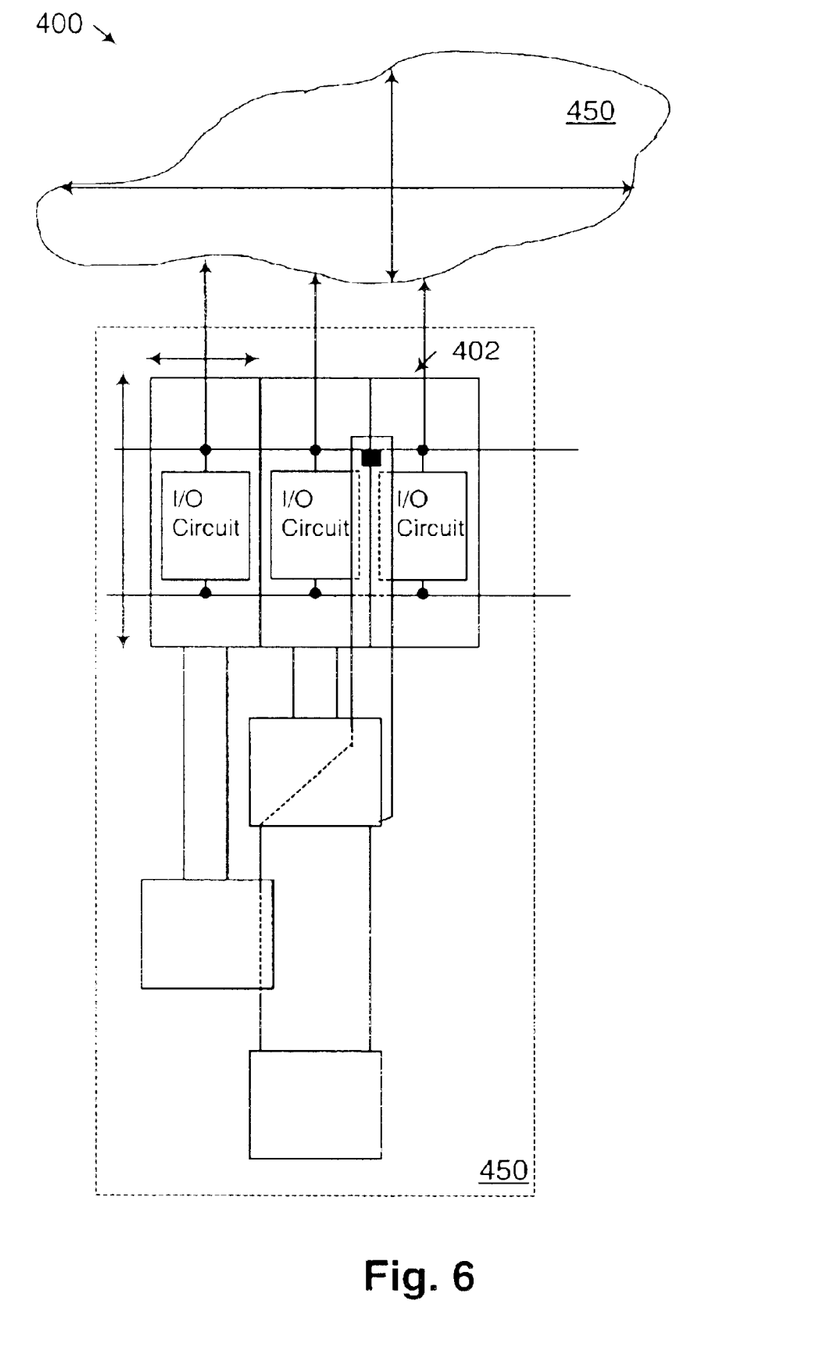
FIG. 6 is a block diagram of an integrated circuit with a wider and shorter I/O ring and an expandable core.

By utilizing the multiple metal layers to route power and ground pads to an I/O ring and using vias to connect the bonding pads to individual components, I/O power and ground slots. FIG. 6 illustrates each slot, reserved for an I/O circuit within I/O ring 402 may be widened and shortened because space is no longer needed to route the power supply (or ground supply) trace conductors. This modification allows core 450 of integrated circuit 400 to expand in area, without affecting the overall area of the die.

Figure 7:
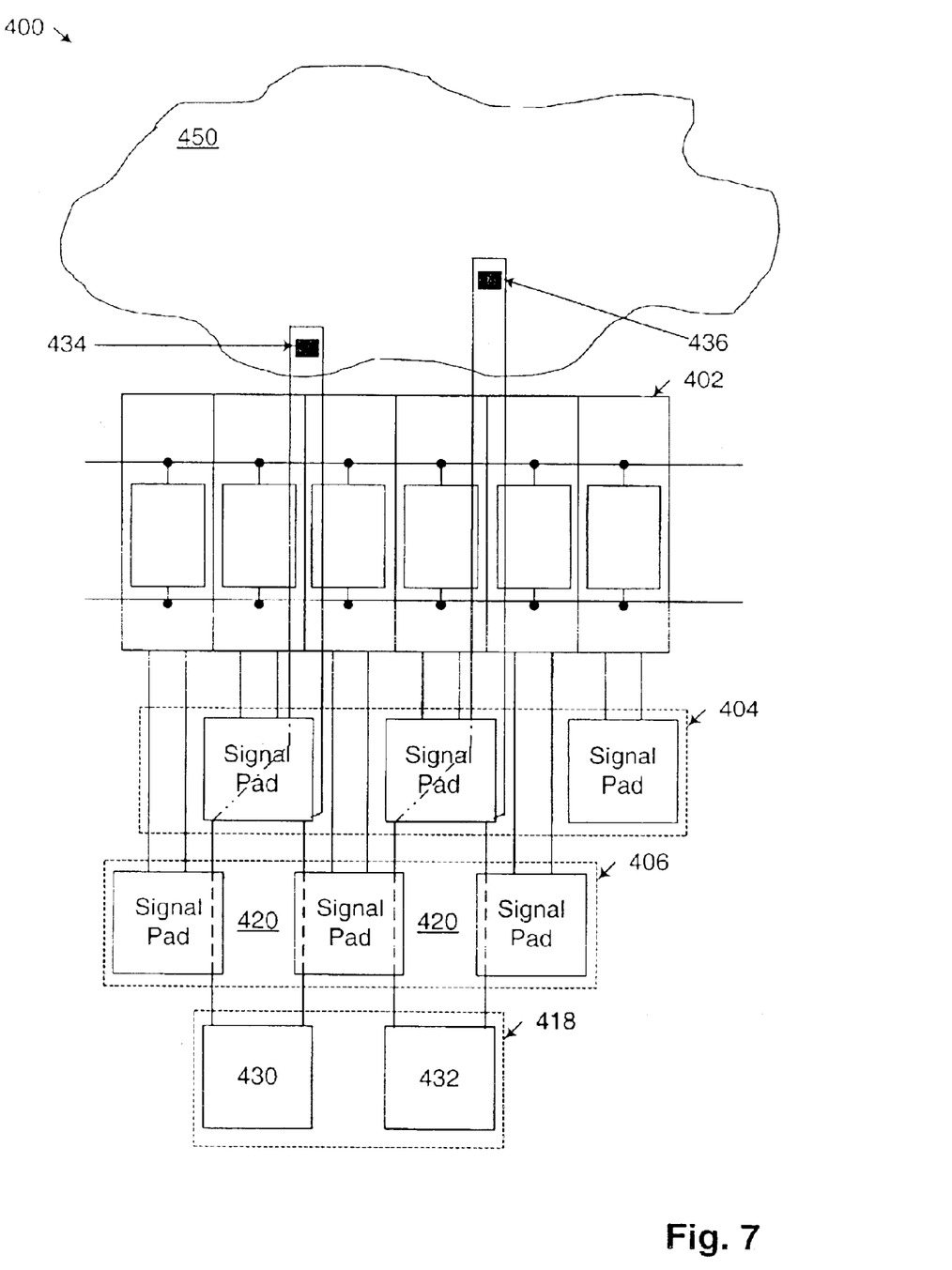
FIG. 7 in an integrated circuit with multiple bond rows in which vias are used to deliver power and ground signals to the core circuitry.

Advantageously, third row 418 may further comprise core power pad 430 and core ground pad 432, as illustrated in FIG. 7. Power pad 430 and ground pad 432 may be routed through I/O ring 402 to core 450 by trace conductors 420. Trace conductors 420 may be routed underneath at least a portion of bonding pads of second row 406 as well as underneath at least a portion of bonding pads of first row 404. The signal provided by power pad 430 is connected to core 450 through via 434. Similarly, the signal provided by ground pad 432 is connected to core 450 through via 436. By utilizing vias and having trace conductors 420 on a separate and distinct metal layers, the routing between core 450 and power pad 430 or ground 432 may eliminate the slot area normally reserved for the power and ground trace conductors if such conductors were configured co-planar to metal conductors in I/O ring 402.

It will be appreciated to those skilled in the art having the benefit of this disclosure that this invention is believed to provide an integrated circuit that includes at least one, or two, or three rows of bonding pads. Every bonding pad within each row is connected to a trace conductor adapted to route the signal to either a core and/or an I/O ring. The trace conductors are on separate and distinct metal layers allowing the routing to be above or below an inner row of bonding pads. The trace conductors are of different metal widths lowering resistance values for longer paths or for protecting the integrity of a signal. It is intended that the following claims be interpreted to embrace all modifications and changes and, accordingly, the specification and drawings are to be regarded in an illustrative rather than a restrictive sense.

What is claimed is:

1. An integrated circuit, comprising:
   a core of circuitry arranged within a central portion of a die comprising the integrated circuit;
   a plurality of input/output circuit surrounding the core of circuitry;
   a plurality of bonding pads coupled to the plurality of input/output circuits and arranged within an outer periphery of the die, wherein the plurality of bonding pads comprise:
      a first row of bonding pads; and
      a second row of bonding pads spaced from, and arranged along an axis parallel to, the first row of bonding pads;
   a first trace conductor extending from a first one of the second row of bonding pads and between a first neighboring pair of the first row of bonding pads; and
   a second trace conductor extending from a second one of the second row of bonding pads, wherein the first trace conductor is of dissimilar width than the second trace conductor.

2. The integrated circuit as recited in claim 1, wherein the first row of bonding pads are configured on a first metal layer and wherein the second row of bonding pads are configured on a second metal layer dielectrically spaced from the first metal layer.

3. The integrated circuit as recited in claim 2, wherein the first and second trace conductors are configured on the second metal layer.

4. The integrated circuit as recited in claim 1, wherein the first and second rows of bonding pads are configured on a first metal layer.

5. The integrated circuit as recited in claim 4, wherein the first and second trace conductors are configured on a second metal layer dielectrically spaced beneath the first metal layer.

6. The integrated circuit as recited in claim 5, further comprising a via extending perpendicular between the second one of the second row of bonding pads and the second trace conductor.

7. The integrated circuit as recited in claim 1 wherein the first trace conductor extends dielectrically beneath a portion of the first neighboring pair of the first row of bonding pads.

8. The integrated circuit as recited in claim 1, wherein the first one and/or the second one of the second row of bonding pads is adapted to receive a power supply or ground.

9. The integrated circuit as recited in claim 2, wherein the first trace conductor extends dielectrically beneath a third trace conductor that extends from the first one of the second row of bonding pads and wherein the third trace conductor is configured on the first metal layer and is spaced between the first neighboring pair of the first row of bonding pads.

10. The integrated circuit as recited in claim 1, further comprising:
   a third row of bonding pads spaced from, and arranged along an axis parallel to, the first and second rows of bonding pads; and
   at third trace conductor extending from a third one of the third row of bonding pads and between a third neighboring pair of the second row of bonding pads.

11. The integrated circuit as recited in claim 10, wherein the first row of bonding pads are configured on a first metal layer, wherein the second row of bonding pads are configured on a second metal layer dielectrically spaced from the first metal layer, and wherein the third row of bonding pads are configured on a third metal layer dielectrically spaced from the first and second metal layers.

12. The integrated circuit as recited in claim 11, wherein the first and second trace conductors are configured on the second metal layer, and wherein the third trace conductor is configured on the third metal layer.

13. The integrated circuit as recited in claim 10, wherein the first, second and third rows of bonding pads are configured on a first metal layer.

14. The integrated circuit as recited in claim 13, wherein the first, second and third trace conductors are configured on a second metal layer dielectrically spaced beneath the first metal layer.

15. The integrated circuit as recited in claim 14, further comprising a via extending perpendicular between the third one of the third row of bonding pads and the third trace conductor.

16. The integrated circuit as recited in claim 1, wherein the plurality of input/output circuits are spaced from, and arranged along an axis parallel to, the first and second rows of bonding pads, and, wherein each of the plurality of input/output circuits is coupled to a corresponding one of the first and second rows of bonding pads reserved exclusively for receiving a signal.

17. The integrated circuit as recited in claim 16, wherein each of the plurality of input/output circuits is dielectrically spaced from a third trace conductor extending from one of the first and second rows of bonding pads reserved exclusively for receiving a power supply or ground.

18. The integrated circuit as recited in claim 17, further comprising a via extending between the third trace conductor and a ground conductor or a power supply conductor that extend across the plurality or input/output circuits.

19. The integrated circuit as recited in claim 17, wherein the third trace conductor extends to the core.

20. A method for routing signals from bonding pads of an integrated circuit, comprising forwarding a signal through a trace conductor of a first width from a first bonding pad placed further from a centralized core of circuitry of the integrated circuit than a neighboring pair of second bonding pads placed closer to the centralized core of circuitry.

21. The method as recited in claim 20, wherein said forwarding comprises routing the signal through a via extending between the trace conductor and the first bonding pad.

22. The method as recited in claim 20, wherein said forwarding comprises configuring the first bonding pad with other bonding pads along an axis parallel to and spaced an axis formed by the neighboring pair of second bonding pads.

23. The method as recited in claim 20, wherein said forwarding comprises configuring the first bonding pad and the second neighboring pair of bonding pads coplanar to each other.

24. The method as recited in claim 20, wherein said forwarding comprises configuring the first bonding pad on a plane dielectrically spaced from another plane on which the second neighboring pair of bonding pads are configured.

25. The method as recited in claim 20, further comprising forwarding another signal through a second trace conductor of a second width dissimilar from the first width, from a second bonding pad placed further from the centralized core of circuitry than another neighboring pair of third bonding pads.

26. An integrated circuit, comprising:
   a first row of bonding pads;
   a second row of bonding pads spaced from, and arranged along an axis parallel to, the first row of bonding pads; and
   a first trace conductor coupled to one of the second row of bonding pads and spaced dielectrically beneath a portion of a neighboring pair of the first row of bonding pads.

27. The integrated circuit as recited in claim 26, further comprising a second trace conductor extending from a second one of the second row of bonding pads.

28. The integrated circuit as recited in claim 27, wherein the first row of bonding pads are configured on a first metal layer and wherein the second row of bonding pads are configured on a second metal layer dielectrically spaced from the first metal layer.

29. The integrated circuit as recited in claim 28, wherein the first and second trace conductors are configured on the second metal layer.

30. The integrated circuit as recited in claim 27, wherein the first and second rows of bonding pads are configured on a first metal layer.

31. The integrated circuit as recited in claim 30, wherein the first and second trace conductors are configured on a second metal layer dielectrically spaced beneath the first metal layer.

* * * * *